(12) United States Patent
Azadet et al.

(10) Patent No.: US 8,949,700 B2
(45) Date of Patent: Feb. 3, 2015

(54) METHOD AND APPARATUS FOR JOINT EQUALIZATION AND DECODING OF MULTIDIMENSIONAL CODES TRANSMITTED OVER MULTIPLE SYMBOL DURATIONS

(71) Applicant: Agere Systems LLC, Allentown, PA (US)

(72) Inventors: Kameran Azadet, Pasadena, CA (US); Erich F. Haratsch, Bethlehem, PA (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 14/104,626

(22) Filed: Dec. 12, 2013

(65) Prior Publication Data

US 2014/0177767 A1 Jun. 26, 2014

Related U.S. Application Data (60) Division of application No. 13/302,707, filed on Nov. 22, 2011, now Pat. No. 8,635,516, which is a continuation of application No. 10/022,665, filed on Dec. 18, 2001, now Pat. No. 8,095,857.

(51) Int. Cl.
*H03M 13/03* (2006.01)
*H04L 25/03* (2006.01)
*H03M 13/39* (2006.01)
(Continued)

(52) U.S. Cl.
CPC ......... *H04L 25/03006* (2013.01); *H03M 13/39* (2013.01); *H03M 13/256* (2013.01); *H03M 13/3961* (2013.01); *H03M 13/4107* (2013.01); *H03M 13/6331* (2013.01); *H04L 25/03305* (2013.01)
USPC .......................................... 714/794; 714/792

(58) Field of Classification Search
CPC .................... H03M 13/3961; H03M 13/39
USPC ................................................. 714/792, 794
See application file for complete search history.

(56) References Cited

U.S. PATENT DOCUMENTS 4,052,671 A * 10/1977 Lange ............................ 375/232
4,713,829 A * 12/1987 Eyuboglu ..................... 375/259

(Continued)

OTHER PUBLICATIONS

Lee, E.A., & Messerschmltt, D.G. (1994), 2nd ed. Digital Communication (pp. 178 and 214). Massachusetts: Kluwer Academic Publishers.

(Continued)

*Primary Examiner* — Joseph D Torres (57) ABSTRACT

Techniques are provided for performing joint equalization and decoding of multidimensional codes transmitted over multiple symbol durations. A reduced state sequence estimation (RSSE) decoder is provided for a multidimensional code. A multidimensional code symbol comprises a number of symbol components of lower dimensionality. The RSSE decodes comprises at least one branch metric unit that calculates branch metrics for a received signal based on intersymbol interference and intrasymbol interference estimates, the at least one branch metric unit compensating for intrasymbol interference caused by symbol components within a current multidimensional code symbol; and a decision feedback unit that processes survivor symbols to calculate the intersymbol interference estimates for different code states of the multidimensional code and channels used to transmit the multidimensional code.

20 Claims, 5 Drawing Sheets

(51) Int. Cl.
*H03M 13/25* (2006.01)
*H03M 13/41* (2006.01)
*H03M 13/00* (2006.01)

(56) References Cited

U.S. PATENT DOCUMENTS

| | | | | |
|---|---|---|---|---|
| 4,730,343 A * | 3/1988 | Kanemasa et al. | ............ | 375/233 |
| 5,031,195 A * | 7/1991 | Chevillat et al. | ............ | 375/234 |
| 5,432,820 A * | 7/1995 | Sugawara et al. | ............ | 375/341 |
| 5,487,069 A * | 1/1996 | O'Sullivan et al. | ............ | 370/404 |
| 5,680,419 A * | 10/1997 | Bottomley | .................... | 375/347 |
| 5,809,060 A * | 9/1998 | Cafarella et al. | ............. | 375/146 |
| 5,963,592 A * | 10/1999 | Kim | ............... | 375/232 |
| 6,009,120 A * | 12/1999 | Nobakht | ...................... | 375/229 |
| 6,081,566 A * | 6/2000 | Molnar et al. | ................ | 375/347 |
| 6,151,370 A * | 11/2000 | Wei | ............... | 375/341 |
| 6,233,286 B1* | 5/2001 | Wei | ............... | 375/265 |
| 6,278,732 B1* | 8/2001 | Beidas et al. | ................ | 375/235 |
| 6,307,901 B1* | 10/2001 | Yu et al. | ........................ | 375/341 |
| 6,389,079 B2* | 5/2002 | Raheli et al. | .................. | 375/262 |
| 6,675,184 B1* | 1/2004 | Matsui | ......................... | 708/322 |
| 6,690,723 B1* | 2/2004 | Gosse et al. | ................. | 375/233 |
| 6,690,754 B1 | 2/2004 | Haratsch et al. | ............. | 375/346 |
| 6,734,920 B2* | 5/2004 | Ghosh et al. | .................. | 348/614 |
| 6,744,806 B1* | 6/2004 | Moore et al. | .................. | 375/130 |
| 6,791,776 B2* | 9/2004 | Kato et al. | ..................... | 360/39 |
| 2009/0016465 A1* | 1/2009 | Ramesh | ....................... | 375/324 |

OTHER PUBLICATIONS

Proakis, J.G. (1995), 3rd ed. Digital Communications (pp. 173, 174 and 566). New York: McGraw-Hill.

Eyuboglu et al., "Reduced-State Sequence Estimation for Coded Modulation on Intersymbol Interference Channels," IEEE J. Select. Areas Commun., vol. 7, pp. 989-995 (Aug. 1989).

Chevillat et al., "Decoding of Trellis-Encoded Signals in the Presence of Intersymbol Interference and Noise," IEEE Trans. Commun., vol. 37, pp. 669-676 (Jul. 1989).

Amca et al, Adaptive Equalisation of Frequency Selective Multipath Fading Channels Based on Sample Selection, IEEE Proceedings Communialions, vol. 146, Issue 1, pp. 55-60 (Feb. 1999).

Wei, L.F., "Trellis-Coded Modulation with Multidimensional Constellations," IEEE Trans. Inform. Theory, vol. IT-33, pp. 483-501 (1987).

* cited by examiner

1D SUBSET PARITIONING
(ONE WIRE PAIR):

```
 2  ■  B
 1  ●  A
 0  ■  B   Δ²=4
-1  ●  A
-2  ■  B
```

4D SUBSETS
(2 WIRE PAIRS):

|  | A-TYPE |  | B-TYPE |
|---|---|---|---|
| S0: | AAAA | U | BBBB |
| S1: | AAAB | U | BBBA |
| S2: | AABB | U | BBAA |
| S3: | AABA | U | BBAB |
| S4: | ABBA | U | BAAB |
| S5: | ABBB | U | BAAA |
| S6: | ABAB | U | BABA |
| S7: | ABAA | U | BABB |

METHOD AND APPARATUS FOR JOINT EQUALIZATION AND DECODING OF MULTIDIMENSIONAL CODES TRANSMITTED OVER MULTIPLE SYMBOL DURATIONS

CROSS-REFERENCE TO RELATED APPLICATIONS

This application is a divisional of U.S. patent application Ser. No. 13/302,707, filed Nov. 22, 2011 which is a continuation of U.S. Pat. No. 8,095,857, issued Jan. 10, 2012, each incorporated by reference herein.

FIELD OF THE INVENTION

The present invention relates generally to channel equalization and decoding techniques, and more particularly, to methods and apparatus for performing joint equalization and decoding of a multidimensional code.

BACKGROUND OF THE INVENTION

Ethernet has become a successful media interface for local area networks (LANs) and has seen an exponential growth in achievable data rates over the past decade. In 1999, the IEEE 802.3ab task force specified the first Gigabit Ethernet over copper standard, 1000BASE-T, which allows for 1 Gb/s communications over four wire pairs of Category 5 unshielded twisted pair (UTP) copper cabling for distances up to 100 m. However, due to the channel characteristics of Category 5 cabling and due to the fact that full duplex transmission is employed on each wire pair, a 1000BASE-T receiver corresponding to one wire pair must cope with a number of impairments, including intersymbol interference (ISI) caused by wire attenuation, echo from its own transmitter, near end crosstalk (NEXT) from the adjacent three local transmitters, far end crosstalk (FEXT) from the remote transmitters of the three adjacent wire pairs, and noise from other sources.

1000BASE-T Gigabit Ethernet employs 4-dimensional trellis-coded modulation (4D-TCM) to improve the noise margin. For a more detailed discussion of 4D-TCM encoding, see, for example, G. Ungerboeck, "Trellis-Coded Modulation With Redundant Signal Sets, Parts I and II," IEEE Commun. Mag., vol. 25, pp. 5-21 (February 1987). Whereas FEXT does not need to be cancelled in a 1000BASE-T implementation, the noise from ISI, echo and NEXT impairments must be removed to achieve a target bit error rate of at least $10^{-10}$. In a digital signal processor (DSP) based VLSI implementation, the number of filter taps needed for the respective cancellers is very high leading to a VLSI implementation with significant power consumption.

Therefore, a Gigabit Ethernet scheme employing four pairs of Category 6 UTP cabling was proposed in K. Azadet et al., "A Gigabit Transceiver Chipset for UTP CAT-6 Cables in Digital CMOS Technology," IEEE Int. Solid-States Circuits Conf. (ISSCC) Dig. Tech. Papers, San Francisco, Calif., 306-307 (February 2000), that leads to a transceiver implementation with significantly lower hardware complexity. Category 6 UTP cabling has significantly better channel characteristics than Category 5 UTP cabling, as it has a bandwidth of 250 MHz (Category 5: 100 MHz) and as it suffers less from NEXT.

Figure 1:
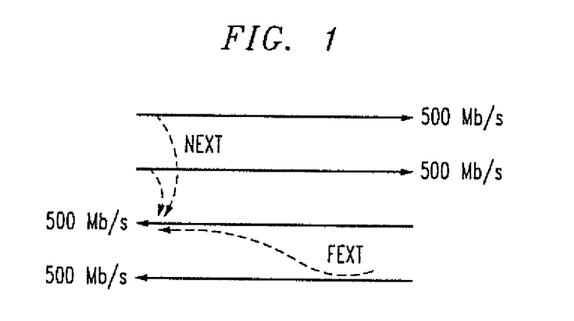
FIG. 1 illustrates the transmission scheme for Category 6 Gigabit Ethernet.

The transmission scheme for Category 6 Gigabit Ethernet is shown in FIG. 1. Each of the four wire pairs transmits data at a rate of 500 Mb/s only in one direction, and two wire pairs are used to achieve an overall data rate of 1 Gb/s for distances up to 100 m. Thus, there is no echo, and there are only two NEXT sources (for 1000BASE-T there are three NEXT sources) and 1 FEXT source (for 1000BASE-T there are 3 FEXT sources) on a single wire pair. For Category 6 UTP cabling, the impairments of NEXT and FEXT are so weak that they do not need to be cancelled to achieve a target bit error rate of at least $10^{-10}$. Also, the postcursor ISI after feedforward equalization is significantly shorter for Category 6 than for Category 5 cabling. Therefore, only ISI must be cancelled in Category 6 Gigabit Ethernet using adaptive equalization, leading to a VLSI implementation with significantly lower hardware complexity and power consumption than the 1000BASE-T standard.

As there is significant postcursor ISI in Category 6 Gigabit Ethernet, 4D-TCM must be employed as well to increase the noise margin. To benefit from the potential coding gain of this coding scheme, joint equalization and trellis decoding must be performed. However, an optimum maximum likelihood sequence estimation (MLSE) detector would be far too complex, and the conventional suboptimum reduced-state sequence estimation (RSSE) algorithm cannot be applied, as the number of channels used for data transmission is smaller than the number of dimensions of the 4D-TCM code. In other words, under a 4D-TCM encoding scheme, two symbols corresponding to two dimensions of the four dimensional code are transmitted successively over the same wire pair. A need therefore exists for a joint postcursor equalizer and trellis decoder for such multidimensional codes, such as the trellis-coded Category 6 Gigabit Ethernet scheme. A further need exists for an RSSE scheme that cancels the intrasymbol interference caused by other symbol components within the same multidimensional code symbol, as well as the intersymbol interference caused by previously transmitted multidimensional code symbols.

SUMMARY OF THE INVENTION

Generally, a method and apparatus are disclosed for performing joint equalization and decoding of multidimensional codes transmitted over multiple one-dimensional symbol durations. According to one aspect of the invention, an RSSE scheme is disclosed that cancels the intrasymbol interference caused by other symbol components within the same multidimensional code symbol. The disclosed RSSE technique for multidimensional codes applies where the number of trellis code dimensions is larger than the number of channels.

The disclosed RSSE decoder computes the intersymbol interference caused by previously decoded multidimensional code symbols and subtracts the intersymbol interference from the received signal. In addition, the intrasymbol interference caused by other symbol components within the same multidimensional code symbol are computed and subtracted from the received signal. The disclosed RSSE decoder for an exemplary 4D-TCM code includes 2D branch metric units (2D-BMU) that calculate the 2D branch metrics for the two wire pairs based on the received 2D signals. A 4D-BMU combines these 2D branch metrics to calculate the 4D branch metrics corresponding to the transitions in the trellis diagram for 4D-TCM. The best surviving paths into the eight code states are determined in an add-compare-select unit (ACSU) and then stored in the survivor memory unit (SMU). The 4D-BMU, ACSU and SMU can be implemented in accordance with known techniques.

According to one aspect of the invention, the 2D-BMUs compensate for intrasymbol interference caused by other symbol components within the same multidimensional code symbol. In addition, the DFU processes the survivor symbols from the SMU to calculate the intersymbol interference estimates for the trellis states and channels, which are used by the 2D-BMUs to calculate the 2D branch metrics.

A more complete understanding of the present invention, as well as further features and advantages of the present invention, will be obtained by reference to the following detailed description and drawings.

DETAILED DESCRIPTION

The present invention provides a modified RSSE technique for multidimensional trellis codes that cancels the intrasymbol interference caused by other symbol components within the same multidimensional code symbol. While the present invention is illustrated herein using an exemplary 4D-TCM encoding scheme, the present invention can be applied to any multidimensional codes transmitted over multiple one-dimensional symbol durations, as would be apparent to a person of ordinary skill in the art. In other words, the disclosed RSSE technique for multidimensional codes applies where the number of trellis code dimensions exceeds the number of available channels. It is noted that while the present invention is illustrated herein using a 4D-TCM code, the present invention can be applied to other multidimensional codes as well, as would be apparent to a person of ordinary skill in the art.

A VLSI prototype of a Gigabit transceiver for Category 6 cabling comprising analog signal processing, clock recovery and digital equalization has been presented in K. Azadet et al., "A Gigabit Transceiver Chipset for UTP CAT-6 Cables in Digital CMOS Technology," IEEE Int. Solid-States Circuits Conf. (ISSCC) Dig. Tech. Papers, San Francisco, Calif., 306-307 (February 2000). However, in the CMOS implementation described therein, channel coding was not employed. Therefore, an illustrative embodiment of the present invention suggests using the same 4D-TCM code that was specified for 1000BASE-T Gigabit Ethernet in "Physical Layer Parameters and Specifications for 1000 Mb/s Operation Over 4 Pairs of Category 5 Balanced Copper Cabling, Type 1000BASE-T," IEEE Standard 802.3ab-1999 (1999), to increase the noise margin of Category 6 Gigabit Ethernet. The present invention provides a joint postcursor equalizer and trellis decoder for such a trellis-coded Category 6 Gigabit Ethernet scheme.

Four-Dimensional Trellis-Coded Modulation (4D-TCM)

The 4D trellis code specified in the 1000BASE-T standard for Category 5 Gigabit Ethernet can be applied to Category 6 Gigabit Ethernet as well. In contrast to 1000BASE-T, however, where the 1D symbols corresponding to the single dimensions of the 4D code are transmitted over four different wire pairs, two symbols corresponding to two dimensions of the 4D code are transmitted successively over the same wire pair in the proposed trellis-coded Category 6 Gigabit Ethernet scheme. This is necessary, because only two wire pairs are used for data transmission in one direction while a 4D trellis code is being employed.

The proposed Category 6 Gigabit Ethernet scheme employs pulse amplitude modulation with the five levels $\{-2, -1, 0, 1, 2\}$ (PAM5) as the signaling scheme on each wire pair. The exemplary 1D symbol rate is 250 Mbaud, and each PAM5 symbol carries 2 information bits. For coding purposes, the PAM5 symbol constellation is divided into the two 1D subsets $A=\{-1, 1\}$ and $B=\{-2, 0, 2\}$. The minimum Euclidean distance between 1D subset A and B is 1. However, the Euclidean distance among symbols of the same 1D subset is $\Delta^2=4$ as shown in FIG. 2.

Figure 2:
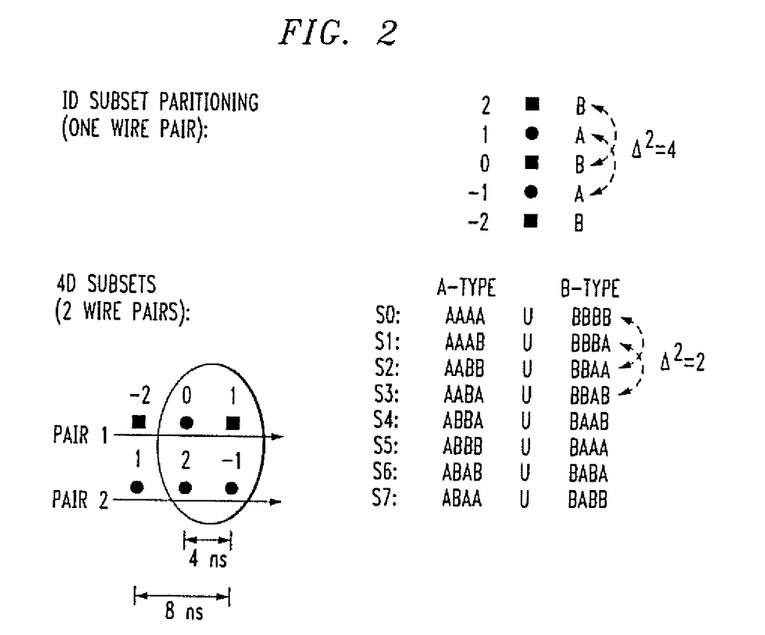
FIG. 2 illustrates the four-dimensional subset partitioning for the 4D-TCM scheme proposed for Category 6 Gigabit Ethernet.

As shown in FIG. 2, by grouping different combinations of four 1D subsets, which are transmitted successively over two wire pairs, the eight 4D subsets S0, S1, ... S7 are formed. Two dimensions of the 4D symbol are transmitted over the first wire pair, and the other two dimensions are transmitted over the second wire pair used for transmission in the same direction. The exemplary 4D symbol rate is 125 Mbaud. Each 4D symbol carries eight information bits. The 4D subset partitioning shown in FIG. 2 guarantees a minimum Euclidean distance of $\Delta^2=4$ between different 4D symbols of the same 4D subset and a minimum distance of $\Delta^2=2$ between 4D symbols of different even subsets (S0, S2, S4, S6) or odd subsets (S1, S3, S5, S7).

Figure 3:
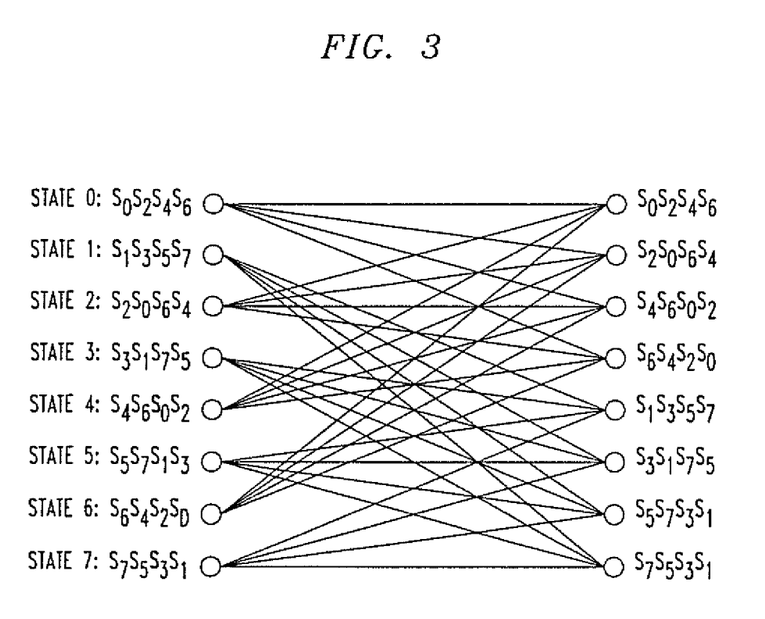
FIG. 3 illustrates the trellis corresponding to the 4D-TCM code of FIG. 2.

The trellis corresponding to this 4D-TCM code is shown in FIG. 3. There are eight states, and four branches leave or enter each state. Each transition in the trellis corresponds to a 4D subset as specified in FIG. 2. Due to the subset partitioning and labeling of the transitions in the code trellis, the minimum Euclidean distance between allowed sequences is $\Delta^2=4$, which corresponds to an asymptotic coding gain of 10 log 4=6 dB over uncoded 4D PAM5 in an ISI free channel with additive white Gaussian noise (AWGN). However, for a fair comparison, the performance gain of the described 4D-TCM code over uncoded 4D PAM4 with the 1D symbol levels $\{-1.5, -0.5, 0.5, 1.5\}$ has to be considered, which also achieves a throughput of 1 Gb/s (2 information bits per PAM4 symbol) at a 1D symbol rate of 250 Mbaud. The performance loss due to the 1D symbol alphabet expansion from PAM4 to PAM5 is 3 dB under the assumption that all 1D PAM4 and PAM5 symbols are equally likely. However, the 4D code symbols of the exemplary 4D-TCM code set have been chosen such that 4D PAM5 code symbols, which are close to the origin in the 4D symbol constellation, are more likely than outer 4D code symbols. Considering this shaping of the 4D PAM5 code symbol constellation, the performance penalty due to the expansion of the symbol constellation reduces to approximately 1.8 dB. This means that the asymptotic, ISI-free coding gain of the discussed 4D-TCM code over uncoded 4D PAM4 is approximately 4.2 dB.

System Model

As in 1000BASE-T Gigabit Ethernet, a Category 6 Gigabit Ethernet receiver would employ a feedforward equalizer for each wire pair after the analog-to-digital conversion to make the channel minimum-phase and whiten the noise. Then, the only impairments, which must be taken care of, are postcursor ISI and AWGN. After feedforward equalization, the postcursor ISI typically spans eight 1D symbol periods, i.e. the postcursor channel memory is L=8.

Figure 4:
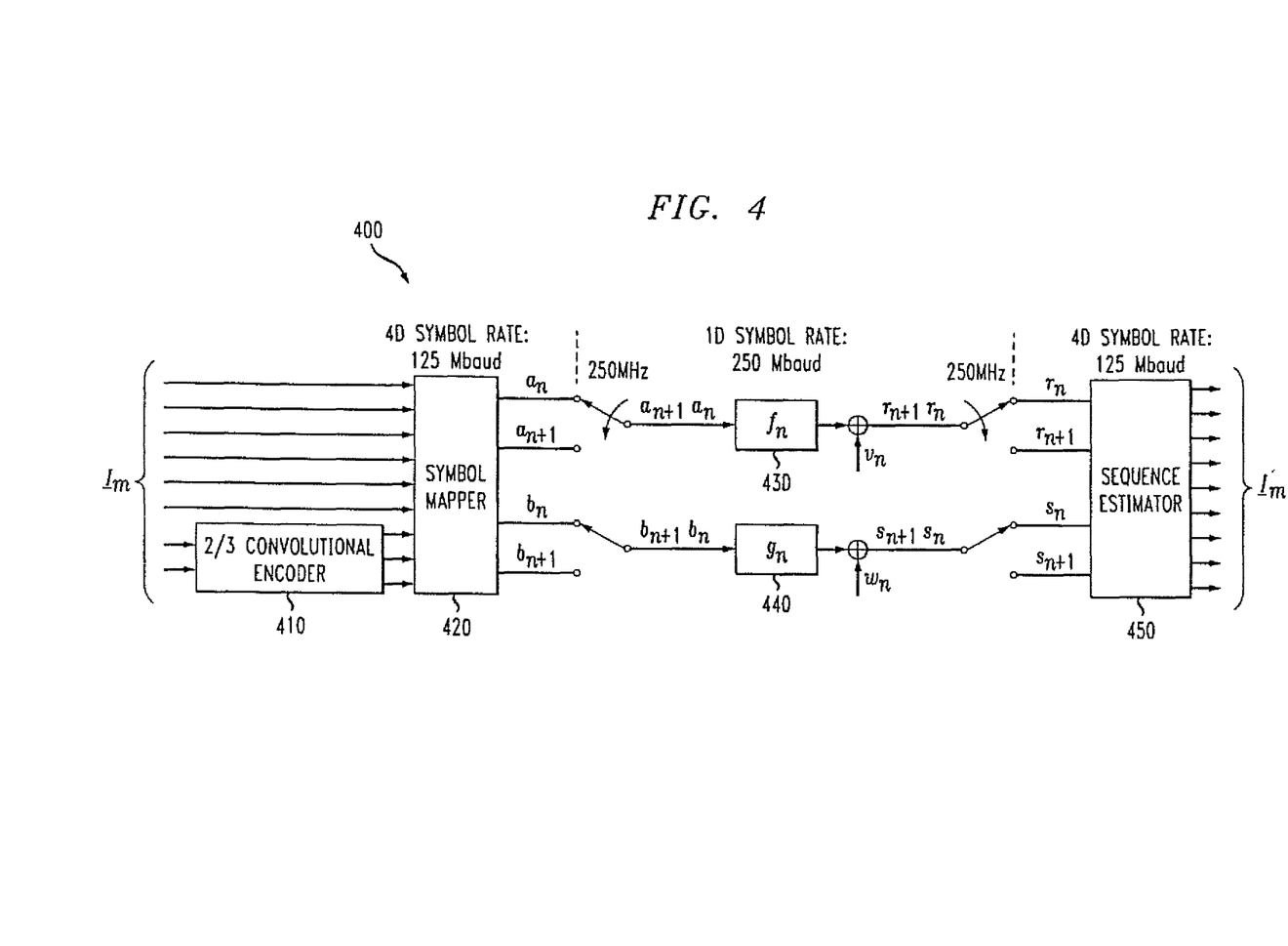
FIG. 4 illustrates the equivalent discrete time channel model for Category 6 Gigabit Ethernet.

The equivalent discrete time model after feedforward equalization for the overall transmission system corresponding to a particular data direction is shown in FIG. 4. Information symbols $\underline{I}_m$ carrying eight information bits are fed into the TCM encoder (410 and 420) at 125 MHz, where in is the time index corresponding to the 4D symbol rate of 125 Mbaud. The rate 2/3 convolutional encoder 410 operates on two information bits to produce three coded bits, which are used to select one of the eight 4D subsets, while the other uncoded bits are used to select one 4D symbol $(a_n, a_{n+1}, b_n, b_{n+1})$ in the symbol mapper 420 within the chosen 4D subset, where the time index n corresponds to the 1D symbol rate of 250 Mbaud. The relationship between m and n is that m is the closest integer smaller than $n/2$: $m = \lfloor n/2 \rfloor$. The 2D component $\underline{a}_m = (a_n, a_{n+1})$ of the 4D symbol is transmitted over the first wire pair, and the other 2D component $\underline{b}_m = (b_n, b_{n+1})$ over the second wire pair. The channel outputs at time n corresponding to the two wire pairs are given by $$r_n = a_n + \sum_{i=1}^{L} f_i a_{n-i} + v_n, \quad (1)$$

$$s_n = b_n + \sum_{i=1}^{L} g_i b_{n-i} + w_n, \quad (2)$$

where $\{f_i\}$ and $\{g_i\}$ at stages 430 and 440, respectively, are the coefficients of the equivalent discrete-time channels corresponding to the two wire pairs. $v_n$ and $w_n$ are the corresponding whitened noise sequences.

The sequence estimator 450 processes the received 4D symbols $(r_n, r_{n+1}, s_n, s_{n+1})$ to output an estimate $\underline{I}'_m$ for the information symbol $\underline{I}_m$. The optimum method of detecting a trellis-coded data sequence in the presence of ISI and AWGN is maximum likelihood sequence estimation (MLSE), which applies the Viterbi algorithm to the super trellis defined by the concatenation of the trellis coder and the two channels with memory. However, MLSE would be prohibitively expensive to implement for Category 6 Gigabit Ethernet due to the large 4D symbol constellation and channel memory. The number of states in the super trellis would be $S \times 2^{BL/2} = 8 \times 2^{8 \times 4} \approx 3.4 \times 10^{10}$, where S is the number of code states and B the number of information bits per 4D symbol.

However, it is not necessary to process all these states to benefit from the coding gain offered by the 4D-TCM code. Most of the gain can be achieved by a sequence estimation method with reduced complexity. It has been shown that compared to other suboptimum joint equalization and decoding algorithms, the reduced-state sequence estimation (RSSE) algorithm or variants of it are a good trade-off between error rate performance, hardware complexity and maximum throughput in high-speed applications such as Gigabit Ethernet over copper.

Multidimensional RSSE

RSSE reduces the hardware complexity of MLSE by processing only a limited number of states. In the following, the simplest form of RSSE is treated where the reduced-state trellis is equal to the code trellis and postcursor ISI is cancelled for each code state separately by taking the symbols from the corresponding survivor path as tentative decisions. In this case, RSSE simplifies to decision-feedback sequence estimation (DSFE). The modified multidimensional RSSE technique employed herein can also be applied when more general RSSE algorithms are used, as would be apparent to a person of ordinary skill in the art.

In the past, RSSE has usually been applied for joint equalization and decoding of 1D or 2D trellis codes. RSSE can also be applied to the 4D trellis code specified in 1000BASE-T without difficulty, as the 4D code symbols are transmitted over four wire pairs, i.e., each dimension of the trellis code has its own channel. However, in the proposed trellis-coded Category 6 Gigabit Ethernet scheme, two dimensions of the specified 4D trellis code are transmitted over the same channel successively, causing problems to apply RSSE in its original form. Specifically, RSSE as described, for example, in M. V. Eyuboglu and S. U. Qureshi, "Reduced-State Sequence Estimation For Coded Modulation On Intersymbol Interference Channels," IEEE J. Select. Areas Commun., vol. 7, 989-995 (August 1989) or P. R. Chevillat and E. Eleftheriou, "Decoding of Trellis-Encoded Signals in the Presence of Intersymbol Interference and Noise," IEEE Trans. Commun., vol. 37, 669-676 (July 1989) only cancels the ISI caused by previously transmitted multidimensional code symbols, but is not able to cancel the intrasymbol interference (InSI), which is caused by other 1D symbol components within the same multidimensional code symbol.

Figure 5:
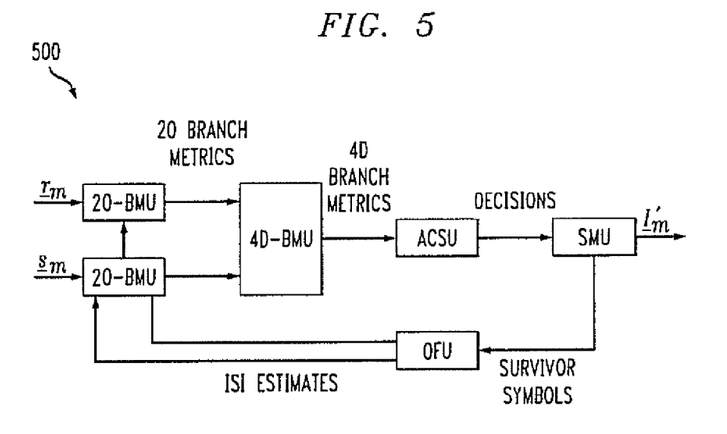
FIG. 5 is a schematic block diagram of an exemplary 4D RSSE architecture in accordance with the present invention.
Figure 6:
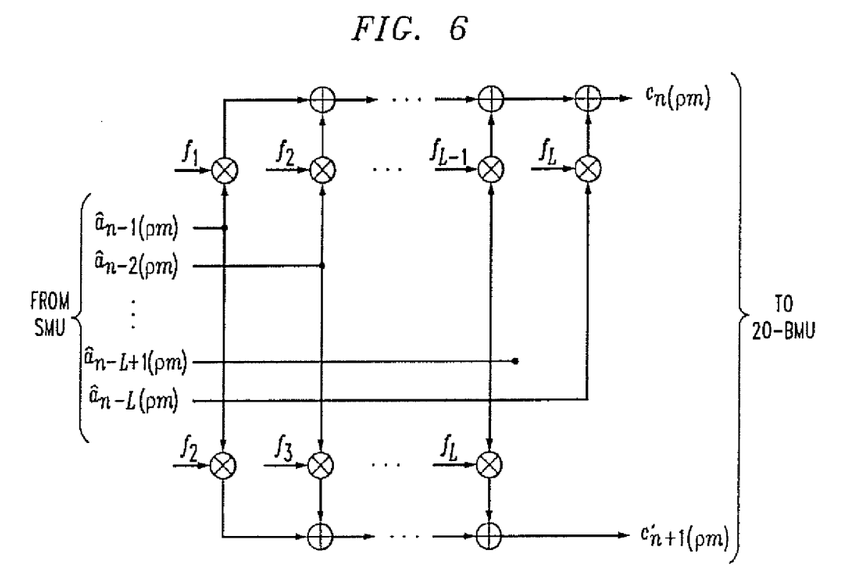
FIG. 6 is a schematic block diagram illustrating the calculation of the ISI estimates in the DFU of FIG. 5.
Figure 7:
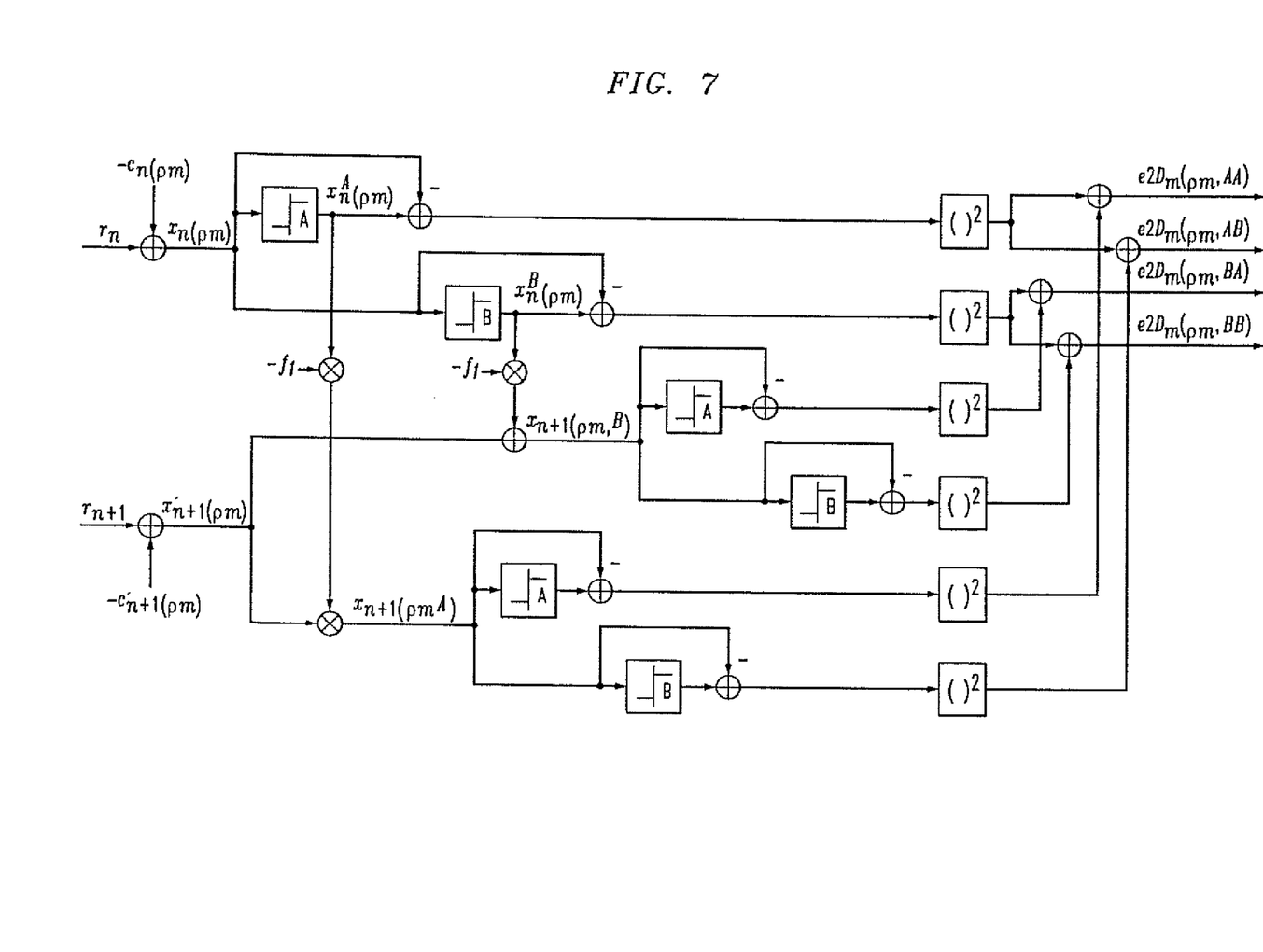
FIG. 7 is a schematic block diagram illustrating the computation of the 2D branch metrics in the 2D-BMU of FIG. 5.

In the case of Category 6 Gigabit Ethernet, the received 2D signal component corresponding to one wire pair, e.g., $\underline{r}_m = (r_n, r_{n+1})$ does not only contain ISI from past 2D symbol components $\underline{a}_{m-j} = (a_{n-2j}, a_{n-2j+1})$, $1 \geq j \geq \lceil L/2 \rceil$ transmitted over this wire pair, but the odd 1D signal component $r_{n+1}$ of $\underline{r}_m$ contains InSI caused by the even 1D symbol component $a_n$ of $\underline{a}_m = (a_n, a_{n+1})$. RSSE in its original form cannot calculate separate InSI estimates for all states at time m as needed, as survivor symbols corresponding to the transmitted 1D signal $a_n$ are not available in the survivor history yet, but become only available at time m+1. Therefore, the present invention provides a modified 4D RSSE structure for Category 6 Gigabit Ethernet as shown in FIGS. 5-7, which can be easily generalized to other multidimensional trellis codes. The proposed 4D RSSE architecture operates at an exemplary clock rate of 125 MHz.

FIG. 5 is a schematic block diagram of an exemplary 4D RSSE decoder 500 in accordance with the present invention. The 2D branch metric units (2D-BMU) calculate the 2D branch metrics for the two wire pairs based on the received 2D signals $\underline{r}_m$ and $\underline{s}_m$. The 4D-BMU combines these 2D branch metrics to calculate the 4D branch metrics corresponding to the transitions in the trellis diagram of FIG. 3. The best surviving paths into each of the eight code states are determined in the add-compare-select unit (ACSU) and then stored in the survivor memory unit (SMU). The decision-feedback unit (DFU) takes the survivor symbols from the SMU to calculate the ISI estimates for all eight code states and two wire pairs, which are used by the 2D-BMUs to calculate the 2D branch metrics.

The 4D RSSE decoder 500 shown in FIG. 5 differs from a conventional implementation of a RSSE decoder for the 1000BASE-T standard in terms of the implementation of the DFU and 2D-BMU, which are explained hereinafter. The 4D-BMU, ACSU and SMU can be implemented, for example, using the 1000BASE-T RSSE decoder described in E. F. Haratsch and K. Azadet, "A 1-Gb/s Joint Equalizer and Trellis Decoder for 1000BASE-T Gigabit Ethernet," IEEE J. Solid-State Circuits, vol. 36, 374-384 (March 2001) or U.S. patent application Ser. No. 09/471,920, filed Dec. 23, 1999, entitled "Method and Apparatus for Shortening the Critical Path of Reduced Complexity Sequence Estimation Techniques," each incorporated by reference herein.

Calculation of ISI Estimates

FIG. 6 is a schematic block diagram illustrating the calculation of the ISI estimates for the trellis code state $\rho_m$ and the first wire pair at time m in the DFU of FIG. 5. This block is required 8×2=16 times, as there are eight code states and two wire pairs. The ISI estimate $c_n(\rho_m)$ corresponding to the even received 1D signal $r_n$ is calculated using the survivor symbols $\{\underline{\hat{a}}_{m-j}(\rho_m)\}=\{(\hat{a}_{n-2j}(\rho_m),\hat{a}_{n-2j+1}(\rho_m))\}$, $1\le j\le\lceil L/2\rceil$ which correspond to $\rho_m$, and are available from the SMU of FIG. 5:

$$c_n(\rho_m)=\Sigma_{i=1}^{L} f_i \hat{a}_{n-i}(\rho_m). \quad (3)$$

The ISI estimate $c'_{n+1}(\rho_m)$ corresponding to the odd received 1D signal $r_{n+1}$ is calculated accordingly:

$$c'_{n+1}(\rho_m)=\Sigma_{i=1}^{L-1} f_{i+1} \hat{a}_{n-i}(\rho_m) \quad (4)$$

However, as previously indicated, $c'_{n+1}(\rho_m)$ does not consider the InSI contained in $r_{n+1}$ caused by the 1D data symbol $a_n$. A survivor symbol corresponding to $a_n$ is not available in the SMU yet. In the RSSE structure of the present invention, the InSI is cancelled in the 2D-BMU, as discussed hereinafter.

Calculation of 2D Branch Metrics

FIG. 7 is a schematic block diagram illustrating the computation of the 2D branch metrics for the first wire pair and state $\rho_m$ in the 2D-BMU of FIG. 5. This block is required 8×2=16 times, as there are eight code states and two wire pairs. First, the ISI estimates calculated according to equations (3) and (4) are used to calculate ISI-free estimates $x_n(\rho_m)$ and $x'_{n+1}(\rho_m)$ for $r_n$ and $r_{n+1}$:

$$x_n(\rho_m)=r_n-c_n(\rho_m), \quad (5)$$

$$x'_{n+1}(\rho_m)=r_{n+1}-c'_{n+1}(\rho_m). \quad (6)$$

Then $x_n(\rho_m)$ is sliced to the closest A-type symbol $x_n^A(\rho_m)$ and B-type symbol $x_n^B(\rho_m)$, respectively. The 1D Euclidean distances between $x_n(\rho_m)$ and the respective sliced signal points are calculated according to $$e1D_n(\rho_m,A)=(x_n(\rho_m)-x_n^A(\rho_m))^2, \quad (7)$$

$$e1D_n(\rho_m,B)=(x_n(\rho_m)-x_n^B(\rho_m))^2. \quad (8)$$

$x_n^A(\rho_m)$ is the A-type data estimate for the transmitted symbol $a_n$, which corresponds to state $\rho_m$. Therefore, an ISI and InSI free estimate $x_{n+1}(\rho_m,A)$ for $r_{n+1}$ under the assumption that $x_n^A(\rho_m)$ is the data estimate for $a_n$ is calculated as $$x_{n+1}(\rho_m,A)=x'_{n+1}(\rho_m)-f_1 x_n^A(\rho_m). \quad (9)$$

Accordingly, assuming that $x_n^B(\rho_m)$ is the data estimate for $a_n$, the ISI and InSI free estimate $x_{n+1}(\rho_m,B)$ for $r_{n+1}$ is given by $$x_{n+1}(\rho_m,B)=x'_{n+1}(\rho_m)-f_1 x_n^B(\rho_m). \quad (10)$$

After slicing $x_{n+1}(\rho_m,A)$ and $x_{n+1}(\rho_m,B)$ to the closest A-type and B-type PAM5 symbols $x_{n+1}^A(\rho_m,A)$, $x_{n+1}^B(\rho_m,A)$, $x_{n+1}^A(\rho_m,B)$ and $x_{n+1}^B(\rho_m,B)$, respectively, the corresponding Euclidean distance metrics are calculated as follows:

$$e1D_{n+1}(\rho_m,AA)=(x_{n+1}(\rho_m,A)-x_{n+1}^A(\rho_m,A))^2, \quad (11)$$

$$e1D_{n+1}(\rho_m,AB)=(x_{n+1}(\rho_m,A)-x_{n+1}^B(\rho_m,A))^2, \quad (12)$$

$$e1D_{n+1}(\rho_m,BA)=(x_{n+1}(\rho_m,B)-x_{n+1}^A(\rho_m,B))^2, \quad (13)$$

$$e1D_{n+1}(\rho_m,BB)=(x_{n+1}(\rho_m,B)-x_{n+1}^B(\rho_m,B))^2. \quad (14)$$

All four possible 2D branch metrics corresponding to the first wire pair and state $\rho_m$ are computed by combining the respective 1D Euclidean distance metrics:

$$e2D_m(\rho_m,AA)=e1D_n(\rho_m,A)+e1D_{n+1}(\rho_m,AA), \quad (15)$$

$$e2D_m(\rho_m,AB)=e1D_n(\rho_m,A)+e1D_{n+1}(\rho_m,AB), \quad (16)$$

$$e2D_m(\rho_m,BA)=e1D_n(\rho_m,B)+e1D_{n+1}(\rho_m,BA), \quad (17)$$

$$e2D_m(\rho_m,BB)=e1D_n(\rho_m,B)+e1D_{n+1}(\rho_m,BB). \quad (18)$$

These 2D branch metrics are then combined with the 2D branch metrics of the second wire pair which are calculated in the same manner as described above to compute the 4D branch metrics corresponding to the trellis transitions from state $\rho_m$, in the 4D-BMU.

It is to be understood that the embodiments and variations shown and described herein are merely illustrative of the principles of this invention and that various modifications may be implemented by those skilled in the art without departing from the scope and spirit of the invention.

We claim:

1. A reduced state sequence estimation decoder for a multidimensional code, wherein a multidimensional code symbol comprises a number of symbol components of lower dimensionality, comprising:
    at least one branch metric unit that calculates branch metrics for a received signal based on intersymbol interference and intrasymbol interference estimates, said at least one branch metric unit compensating for intrasymbol interference caused by symbol components within a current multidimensional code symbol; and
    a decision feedback unit that processes survivor symbols to calculate the intersymbol interference estimates for different code states of said multidimensional code and channels used to transmit said multidimensional code.

2. The reduced state sequence estimation decoder of claim 1, wherein multidimensional code symbols are transmitted over more than one symbol interval that is used to transmit one of said symbol components.

3. The reduced state sequence estimation decoder of claim 1, wherein said multidimensional code symbol comprises a number of transmitted symbol components of lower dimensionality that exceeds a number of available channels.

4. The reduced state sequence estimation decoder of claim 1, wherein said at least one branch metric unit is further configured to:
    calculate intrasymbol interference free estimates based on possible data symbol values; and
    calculate branch metrics based on a received signal and said intersymbol interference and intrasymbol interference estimates.

5. The reduced state sequence estimation decoder of claim 1, further comprising an add-compare-select unit to determine a best surviving path into a trellis state.

6. The reduced state sequence estimation decoder of claim 1, wherein said multidimensional code is 4D-TCM.

7. The reduced state sequence estimation decoder of claim 1, wherein said multidimensional code is 4D-TCM.

8. The reduced state sequence estimation decoder of claim 1, wherein said at least one branch metric unit is further operative to calculate a metric for an initial symbol component using survivor symbols from a corresponding state to account for intersymbol interference, wherein said metric is used for the calculation of a branch metric.

9. The reduced state sequence estimation decoder of claim 8, wherein said at least one branch metric unit is further operative to calculate a metric for a subsequent symbol component using survivor symbols from a corresponding state to account for intersymbol interference and using at least one data estimate to account for intrasymbol interference.

10. The reduced state sequence estimation decoder of claim 9, wherein said at least one branch metric unit is further operative to calculate a combined metric by combining said metric for said initial symbol component and said metric for said subsequent symbol component.

11. A method for processing a multidimensional code, wherein a multidimensional code symbol comprises a number of symbol components of lower dimensionality, comprising:
   calculating branch metrics for a received signal based on intersymbol interference and intrasymbol interference estimates, wherein said calculated branch metrics compensate for intrasymbol interference caused by symbol components within a current multidimensional code symbol; and
   processing survivor symbols to calculate the intersymbol interference estimates for different code states of said multidimensional code and channels used to transmit said multidimensional code.

12. The method of claim 11, wherein multidimensional code symbols are transmitted over more than one symbol interval that is used to transmit one of said symbol components.

13. The method of claim 11, wherein said multidimensional code symbol comprises a number of transmitted symbol components of lower dimensionality that exceeds a number of available channels.

14. The method of claim 11, wherein said step of calculating branch metrics further comprises the steps of:
   calculating intrasymbol interference free estimates based on possible data symbol values; and
   calculating branch metrics based on a received signal and said intersymbol interference and intrasymbol interference estimates.

15. The method of claim 11, further comprising the step of determining a best surviving path into a trellis state.

16. The method of claim 11, wherein said multidimensional code is 4D-TCM.

17. The method of claim 11, wherein said multidimensional code is 4D-TCM.

18. The method of claim 11, further comprising the step of calculating a metric for an initial symbol component using survivor symbols from a corresponding state to account for intersymbol interference, wherein said metric is used for the calculation of a branch metric.

19. The method of claim 18, further comprising the step of calculating a metric for a subsequent symbol component using survivor symbols from a corresponding state to account for intersymbol interference and using at least one data estimate to account for intrasymbol interference.

20. The method of claim 19, further comprising the step of calculating a combined metric by combining said metric for said initial symbol component and said metric for said subsequent symbol component.

* * * * *